United States Patent [19]

Pasco et al.

[11] 4,221,748
[45] Sep. 9, 1980

[54] METHOD FOR MAKING POROUS, CRUSHABLE CORE HAVING A POROUS INTEGRAL OUTER BARRIER LAYER HAVING A DENSITY GRADIENT THEREIN

[75] Inventors: Wayne D. Pasco, Ballston Spa; Frederic J. Klug, Amsterdam, both of N.Y.

[73] Assignee: General Electric Company, Schenectady, N.Y.

[21] Appl. No.: 6,278

[22] Filed: Jan. 25, 1979

[51] Int. Cl.² .......................... B22D 29/00; B29H 7/20
[52] U.S. Cl. ..................................... 264/43; 106/38.9; 106/40 R; 106/41; 106/65; 106/73.4; 164/41; 164/132; 264/44; 264/45.5; 264/65; 264/82
[58] Field of Search ................ 264/43, 44, 45.5, 82, 264/65; 106/65, 73.4, 40 R, 41, 38.9

[56] References Cited

U.S. PATENT DOCUMENTS

| | | | |
|---|---|---|---|
| 2,593,507 | 4/1952 | Wainer | 264/44 |
| 3,538,202 | 11/1970 | Bidard | 264/44 |
| 3,549,736 | 12/1970 | Waugh | 264/44 |
| 4,164,424 | 8/1979 | Klug et al. | 264/43 |

OTHER PUBLICATIONS

Gitzen, W. H., "Alumina as a Ceramic Material," pub. by Amer. Cer. Soc. (1970), pp. 27–28, 30, 36–38, 104–105, 130–131.

Primary Examiner—Helen M. McCarthy
Attorney, Agent, or Firm—Donald M. Winegar; James C. Davis, Jr.; Leo I. MaLossi

[57] ABSTRACT

A method for simultaneously forming an integral porous outer barrier layer having a density gradient therein on selected external surfaces of a fired ceramic article and for increasing the porosity content and crushability characteristics thereof embodies the firing of a ceramic compact comprising a reactant fugitive filler material and a ceramic material in a controlled atmosphere.

18 Claims, 7 Drawing Figures

WEIGHT LOSS DUE TO REACTION
BETWEEN GRAPHITE & ALUMINA

MOLAR RATIO
○ G/A = 0
⊙ G/A = 0.25
□ G/A = 0.75
△ G/A = 1.25

METHOD FOR MAKING POROUS, CRUSHABLE CORE HAVING A POROUS INTEGRAL OUTER BARRIER LAYER HAVING A DENSITY GRADIENT THEREIN

RIGHTS GRANTED TO THE UNITED STATES OF AMERICA

The Government of the United States of America has rights in this invention pursuant to Contract No. F33615-77-C-5200 awarded by the Department of Defense.

BACKGROUND OF THE INVENTION

1. Field of the Invention

This invention relates to improvements in investment casting and in particular to a new and improved process for making alumina cores for employment therewith.

2. Description of the Prior Act

The production of directionally solidified (DS) metal eutectic alloys and superalloys for high pressure turbine (HPT) airfoils with intricate internal passageways for air cooling requires that the core and mold not only be dimensionally stable and sufficiently strong to contain and shape the casting but also be sufficiently weak to prevent mechanical rupture (hot cracking) of the casting during solidification and cooling. The DS process requirements of up to 1875° C. for a 16 hr. time period imposes severe constraints on materials which may serve as mold or core candidates.

The prior art appears to be mostly limited to the use of silica or silica-zircon core and mold materials. At temperatures greater than 1600° C. the silica based materials fail from the standpoint of both mechanical integrity and chemical incompatibility with the advanced alloy compositions.

Dimensional control of the silica core is excellent since cristobalite exhibits very little densification. Microstructural examination reveals that, in some cases, commercial core compositions employ very large particles (>100 μm). The addition of large particles serves to lower both shrinkage and mechanical strength.

Paul S. Svec in "Process for Making an Investment Mold for Casting and Solidification of Superalloys Therein", Ser. No. 590,970, teaches the use of alumina-silica compositions for making molds and cores. Charles C. Greskovich and Michael F. X. Gigliotti, Jr. in U.S. Pat. Nos. 3,955,616 and 3,972,367 teach cores and molds of alumina-silica compositions which have a barrier layer of alumina formed at the mold/metal interface. One possible means for the formation of their alumina layer is by a chemical reaction wherein carbon of the susceptor chemically reduces the material composition of the mold or core. Charles D. Greskovich in U.S. Pat. No. 4,046,344 also teaches an alumina-silica composition wherein the material is of a predetermined size so as to favor, and therefore enable, the formation of metastable mullite for molds and cores which exhibit superior sag resistance at high temperature.

Aluminum oxide by itself, without a chemical or physical binder material, has been identified as a potential core and mold material based on both chemical compatibility and leachability considerations. There is, however, a considerable thermal expansion mismatch between the ceramic core and the alloy which generates, around the ceramic core, hoop and longitudinal tensile stresses in the alloy on cooling from the DS temperature. The high elastic modulus and high resistance to deformation at elevated temperatures of dense alumina and its lower coefficient of thermal expansion than the alloy result in the mechanical rupture or hot tearing of the alloy.

A mechanism by which an alumina core body can deform under the strain induced by the cooling alloy has been developed to permit the production of sound castings. The microstructure of the ceramic core and mold has been tailored to permit deformation under isostatic compression at a stress low enough to prevent hot tearing or cracking of the alloy. The surface of the core and mold also serves as a barrier to metal penetration. The core has a central portion having continuous porosity therein and good crushability characteristics. A barrier layer having discontinuous porosity encompasses, and is integral with, the central portion of the core. The core is easily removed from the casting with minimum effort and little effect on the quality of the cast metal by autoclave aqueous caustic solutions.

However, it has been discovered in cores having a complex geometry that the dimensional tolerances desired are difficult to attain. In fact, nonuniform shrinkage often occurs which results in minor but unacceptable distortions. The distortion results from the oxidation of carbon, a fugitive filler material, from the core in a non-uniform fashion. Regions of a core with a high surface area-to-volume ratio lose more carbon than regions with a low surface area-to-volume ratio. Greater densification occurs in the carbon depleted regions, thus giving rise to the differential shrinkage that causes distortion of the core.

An object of this invention is to provide a new and improved core for casting directionally solidified eutectic and superalloy materials having superior porosity and crushability characteristics than prior art cores.

Another object of this invention is to provide a new and improved core for casting directionally solidified eutectic and superalloy materials, wherein the material of a central portion thereof has a continuous porous microstructure and the grain morphology is characteristic of grains which have undergone vapor phase transport action. A layer of alumina encompasses, and is integral with, the central portion. The integral outer layer has a density gradient therein and continuous porosity therein and the porosity therein is small enough to prevent metal penetration.

A further object of this invention is to provide a new and improved process for making alumina cores for use in casting superalloy materials.

Other objects of this invention will, in part, be obvious and will, in part, appear hereinafter.

BRIEF DESCRIPTION OF THE INVENTION

In accordance with the teachings of this invention there is provided a new and improved process for making an alumina core for use in the investment casting of directionally solidified eutectic and superalloy materials. The method includes the process steps of preparing a material composition consisting essentially of an organic binder, a reactant fugitive filler material and an alumina flour. The particle size of the alumina flour and the reactant fugitive filler material is less than about 300 microns. The binder exists as less than 50 percent of the volume of the green core. A portion of the material composition is then worked into a preform of a predetermined shape of the ceramic article to be produced. The preform is then heated to remove the organic binder while retaining substantially all of the reactant fugitive filler material therein. Heating is then continued in a controlled atmosphere to react the alumina and the reactant-fugitive filler material to produce at least one of more suboxides of alumina. The one or more suboxides of alumina are vapor transported throughout the fired preform to produce a ceramic article having a predetermined porosity content, grain morphology, and crushability characteristics. A portion of the suboxides of alumina are oxidized to form a porous integral barrier layer of alumina at the surface of the ceramic article, the layer having a density gradient across its thickness. The remainder of the suboxides escapes from the core resulting in a net weight loss.

The ceramic article comprises an outer portion which encompasses and is integral with a central portion. The material of the outer portion, besides having the density gradient, is porous and the porosity therein is continuous. The material of the inner portion has a porous microstructure of alumina having a grain morphology which is characteristic of grains which have undergone vapor phase transport action. The porosity is continuous throughout the central portion of the ceramic article. The vapor transport action results in a network of narrow connecting bridges between the alumina particles.

DESCRIPTION OF THE INVENTION

Figure 1:
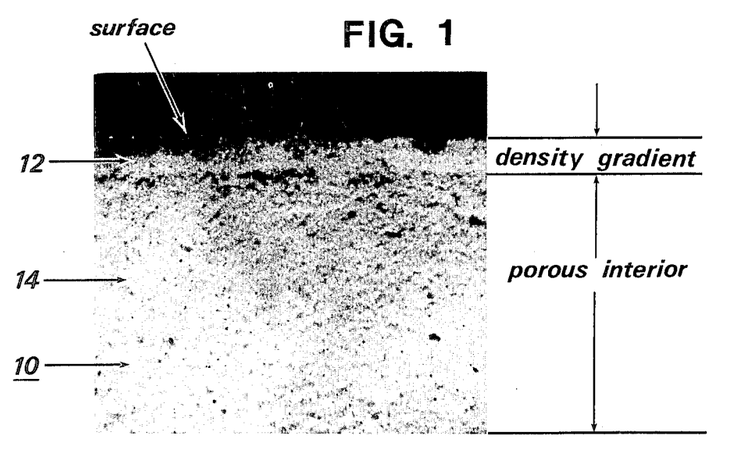
FIG. 1 is a photomicrograph of a portion of a cross sectioned alumina compact (20×).
Figure 2:
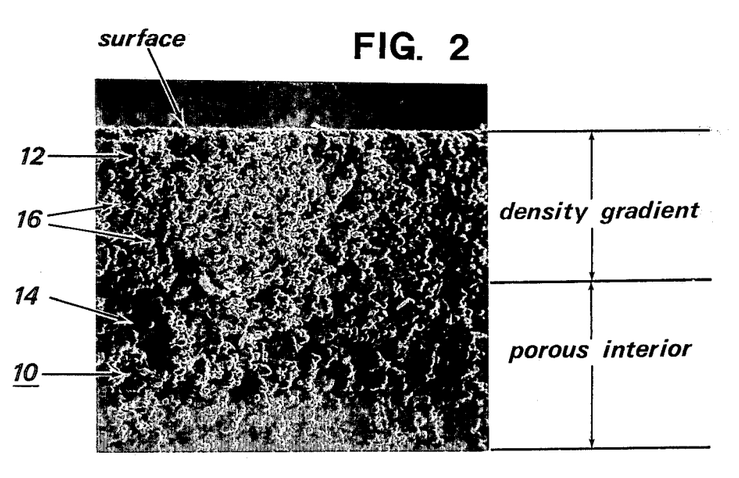
FIG. 2 is a scanning electron micrograph at 75× of a portion of a fired compact of alumina.
Figure 3:
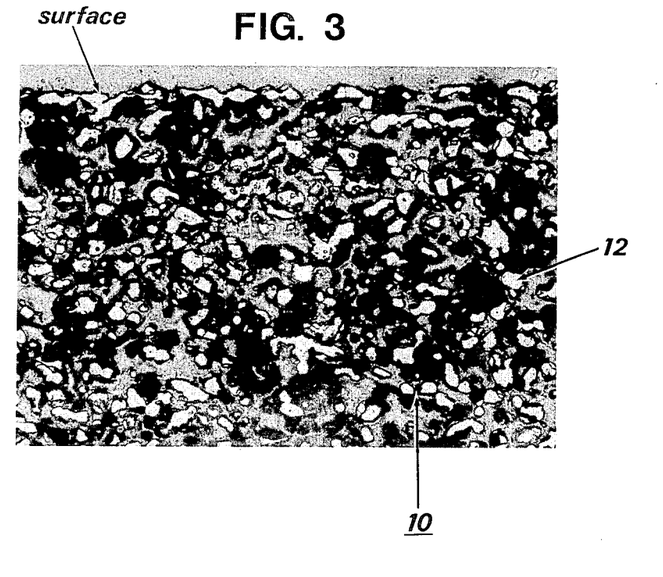
FIG. 3 is a photomicrograph of a portion of a fired compact of alumina at 250×.

With reference to FIGS. 1, 2 and 3 there is shown a portion of a compact 10 made from an alumina ceramic material composition embodying a reactant fugitive filler material. The compact 10 is made of alumina material fired in a controlled atmosphere to form a layer 12 of alumina as an outer portion encompassing, and integral with, a central portion 14 of alumina. The alumina of the layer 12 has a density gradient and porosity which is continuous throughout as illustrated in FIG. 3. The structure of the material of the central portion 14 is porous and the porosity is also continuous throughout.

As better illustrated with reference to FIG. 2, the microstructure of the central portion 14 of the fired compact 10 has a porosity content of ~50% by volume and is continuous throughout. Other compacts can be made with porosity contents ranging from 20% to 65% by this method. Additional examination of the alumina grains 16 clearly indicates a grain morphology which is characteristic of alumina grains which have undergone vapor phase transport action. The vapor transport action involves the evaporation and/or formation of a gaseous suboxide of a portion of material of one grain at high surface energy regions of the grain and the transportation of the material to low surface energy regions of the grain where it condenses or is oxidized. By this action the alumina grains 16 become coarse and rounded. Additionally, aluminum suboxide gaseous species are transported away from the center portion 14 of the compact 10 where at least some of the species approaches the outer surface thereof and reacts with the oxygen in the ambient atmosphere to form the integral outer portion 12 of alumina having a density gradient therein. As a result of the chemical reaction producing this vapor transport action, the fired compact registers a weight loss. Further, the vapor transport action results in a network of narrow connecting bridges, not readily distinguishable because of the magnification of the photomicrograph, between the alumina particles or grains 16.

The compact 10 is suitable for use as a core in investment casting of directionally solidified eutectic and superalloy materials. It is desirable for the cooling passages of the turbine blade to have a complex configuration. Therefore, it is necessary for the compact or core to have a complex shape. The preferred method of forming the compact or core 10 in an unfired state is by injection or transfer molding. The preferred material for the compact or core 10 is alumina or magnesia doped alumina because casting temperatures are in excess of 1600° C. and as high as 1850° C. while directional solidification times are in excess of 16 hours.

Figure 4:
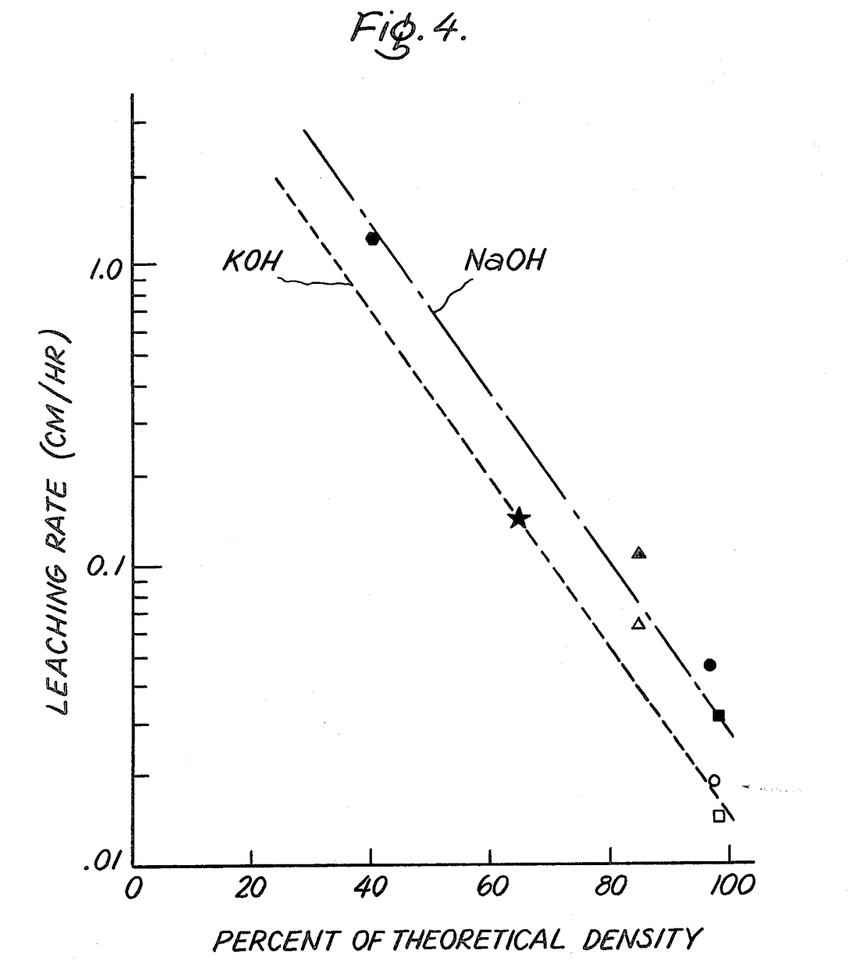
FIG. 4 is a plot of Log of the leaching rate versus theoretical density of a fired alumina compact.

The alumina compact 10 is easily removed from the casting by leaching in a KOH or a NaOH solution in an autoclave. The leaching rate, however, is dependent upon the porosity of the compact 10. As shown in FIG. 4, if one can manufacture a compact 10 with an interior portion having a porosity content of from 40 percent to 60 percent by volume, a very significant leaching rate of the compact 10 is obtainable. Additionally, the compact 10 would make an acceptable core for making turbine blades wherein the wall thickness is about 0.060 inch or less since it will have good crushability characteristics.

In injection molding, the solids content of the material composition employed to form a compact to function as a core, and having a complex shape, initially must be in excess of 50 percent by volume to prevent the solids included therein from becoming a discontinuous phase. Should the solid material become a discontinuous phase; upon binder removal and before sintering occurs, the compact may deform or disintegrate.

To increase porosity in the fired compact a reactant fugitive filler material is desirable. The reactant fugitive filler material provides, along with the alumina material, the total solids content necessary for injection molding. Upon a subsequent firing at an elevated temperature, the reactant fugitive filler is reacted in a suitable manner to increase the porosity content of the compact 10. A desirable reactant fugitive filler material is one which will also react with the alumina to eliminate or remove a portion thereof from the compact 10 and thereby increase the porosity content further. Suitable fugitive filler materials are those which will provide enough reactant material at the elevated temperature to reduce a portion of the alumina which, in part, is removed from the compact in the gaseous state and which, in part, is either deposited on other alumina grains by vapor phase transport action causing coarsening and a rounding thereof or oxidized to form the integral outer portion 12 of alumina. Preferred reactant bearing materials are graphite, aluminum, aluminum carbide, aluminum oxycarbide, boron and boron carbide. Suitable organic materials may also be employed as reactant materials as a carbon source.

The reactant fugitive filler material is usually a particular material mixed with the ceramic material. These two materials are the key ingredients for making the fired ceramic articles such as a core for a casting. For injection molding purposes a plasticizing vehicle system is added. The plasticizing system is generally solely for making the material composition injection moldable for ease of fabrication with minimum work required and minimum wear on the tooling, including dies. Normally the ingredients of the plasticizing systems are removable by melting or volatilization means before or during presintering operations whereas substantially all of the reactant fugitive filler material must be retained for the higher temperature processing relied upon to produce articles from the claimed material composition.

However, if a carbonaceous material could act as part of the plasticizing system, and if part or substantially all of it could furnish part or all of the required amount of reactant filler material in the claimed material composition, then such carbonaceous material is most desirable. Further, such carbonaceous material itself will chemically react with the alumina in the same manner to produce the desired ceramic structure when the claimed material composition is utilized.

The reactant fugitive filler (Rff) material is present in the material composition to chemically react with the ceramic material and produce vapor phase suboxide species thereof which are then evolved in the vapor phase from the article during firing to achieve a desired level of porosity in the article. Some of the suboxide species is oxidized and redeposits on some of the ceramic grains producing some grain growth by vapor transport action. At the same time some densification may occur because of bulk diffusion but the dominating process is vapor transport which is initiated and continues to be carried out by the chemical reaction of the Rff material with the ceramic material. The Rff material and a portion of the ceramic material are used up chemically and evolve as a gas. The volume or space left void helps to produce the desired increase in porosity in the fired ceramic article.

The reactant fugitive filler material preferably has a particle size of the order of 300 microns or less. The particle size of the alumina is important. It is desirable that the size of the pores in the compact, particularly at the outside surfaces which contact the cast metal, be small enough to prevent any significant metal penetration. It is desirable that metal penetration of the compact surface be minimized in order to obtain the best surface possible for the casting. The integral outer portion 12 of porous varying density alumina functions as a barrier layer to prevent metal penetration into the core structure. The particle size distribution of the alumina has a significant effect on the rheology of the wax-carbon-alumina systems. The alumina should have an average particle size of 40 microns or less. The preferred average particle size range is from 1–20 microns.

Suitable alumina material is obtainable as fused alumina powder from the Norton Company. Suitable alumina powders are:
(a) Norton 38-900 Alundum wherein the particle size distribution is typically as follows:

| Particle Size | Weight Percentage |
|---|---|
| 0–5μ | 55.5 |
| 5μ–10μ | 34.0 |
| >10μ | remainder |

(b) Norton-500 mesh Alundum
(c) Norton-600 mesh Alundum

Various blends of the flour powders may also be combined into a flour mixture.

One or more waxes can be employed to provide adequate deflocculation, stability and flow characteristics. The plasticizing vehicle system preferably consists of one or more paraffin type waxes which form the base material. A purified mineral wax ceresin may also be included in the base material. To 100 parts of the base wax material additions of oleic acid, which acts as a deflocculent, white beeswax, which acts as a deflocculent and aluminum stearate, which acts to increase the viscosity of the base wax, are added. A preferred plasticizing vehicle has the following composition:

| Binder: | Material | | Part by Weight | |
|---|---|---|---|---|
| | P-21 paraffin (Fisher Scientific) | | 33⅓ | |
| | P-22 paraffin (Fisher Scientific) | | 33⅓ | |
| | Ceresin (Fisher Scientific) | | 33⅓ | |
| | | Total | 100 parts | |
| | | | Part by Weight | |
| Additives: | Material | Range | Preferred | Typical |
| | oleic acid | 0–12 | 6–8 | 8 |
| | beeswax, white | 0–12 | 3–5 | 4 |
| | aluminum stearate | 1–6 | 1–4 | 3 |

Despite the addition of defloccculent, large particle size, of the order of >50μ, can settle at a rather rapid rate in the wax and can change the sintering behavior of the remainder of the material mix of the molding composition material. The rate of settling of large particles is adjusted by varying the viscosity of the liquid medium, wax. To this end aluminum stearate is added to the wax to increase viscosity by gelling. Increased viscosity also has the additional benefits of preventing segregation of the wax and solids when pressure is applied and reducing the dilatancy of the material mixture.

In order to describe the invention more fully, and for no other reason, the reactant fugitive filler material is said to be a carbon bearing material. The amount of carbon bearing material added to the core composition mix is dependent upon the porosity desired in the fired core as well as the average particle size of the alumina material. The carbon material present in the core material mix as graphite has a molar ratio of carbon to alumina (G/A) of $0 < G/A \leq 1.25$. A preferred molar ratio range is $0.1 \leq G/A \leq 0.4$. This molar ratio range has been found to provide excellent results. Best results are achieved when $0.20 \leq G/A \leq 0.30$. The graphite is retained in the bisque ceramic during heating until the alumina begins to sinter and develops strength at the alumina-alumina particle contacts. The graphite can now be removed from the structure, or compact, without producing a discontinuous solid phase that could cause distortion of the compact.

The expected chemical reactions between alumina and carbon occur at temperatures greater than 1500° C. in a reducing or inert atmosphere. The result of these reactions is the production of volatile suboxides of alumina. The possible reactions are:

with (2) being the most probable reaction to occur.

At temperatures above 1500° C., the vapor pressure of the suboxide is significant. As the vapor pressure increases, mass transport by an evaporation-condensation type mechanism can occur. If the rate of mass transport through the vapor phase is much greater than mass transport by volume or grain boundary diffusion, the material is merely rearranged in the compact and little or no reduction in the pore volume (i.e. densification) can take place. In the reducing or inert atmosphere, the suboxide can escape thereby lowering the density of the compact or fired ceramic and producing the microstructure of the central portion 14 of the compact 10 as illustrated in FIGS. 1 and 2.

The effect of carbon additions, in the form of graphite, on the weight loss of the ceramic article when fired in a reducing atmosphere, such as hydrogen, is a function of atmosphere and consequent heating rate above about 900° C.

When the heating rate is less than the order of about 100° C. per hour in the temperature range of from about 900° C. to about 1500° C., with oxygen present as an impurity in the controlled atmosphere, the expected porosity content is not obtained. Apparently, the carbon reacts with the gaseous oxygen impurity to form gaseous CO and $CO_2$, which escapes from the compact. Consequently, insufficient carbon is available above about 1500° C. to reduce the alumina to a gaseous suboxide and produce the fired compact of desired porosity content. With the material composition described and in the controlled atmosphere to be discussed, the heating rate practiced is of the order of 300° C./hour up to 1800° C. However, the most practical method of preventing oxidation of carbon is by proper atmosphere control.

Controlled atmospheres for firing the compact and to obtain the desired chemical reactions in the remaining material may be of a reducing type or of an inert gas type having superflow oxygen content levels. Hydrogen may be employed as a reducing gas type atmosphere. Argon, helium, neon and the like may be utilized for atmospheres of the inert gas type.

The furnace atmosphere is controlled during the chemical reaction of the reactant fugitive filler material for another reason. A portion of the aluminum suboxide is transported to the surface, or close to the surface, of the core where it is oxidized. The oxidation will occur in the surface regions only if the furnace atmosphere is properly controlled. The oxidation of aluminum suboxide results in deposition of alumina at or near the surface, which locally increases the density of the core. A density gradient forms with the density gradually increasing as the surface of the core is approached from the interior. This density gradient completely surrounds the core and although the porosity is continuous throughout, the pore size is small enough to serve as a barrier to prevent metal penetration into the core or mold when hot metal is cast about the fired ceramic compact.

Figure 5:
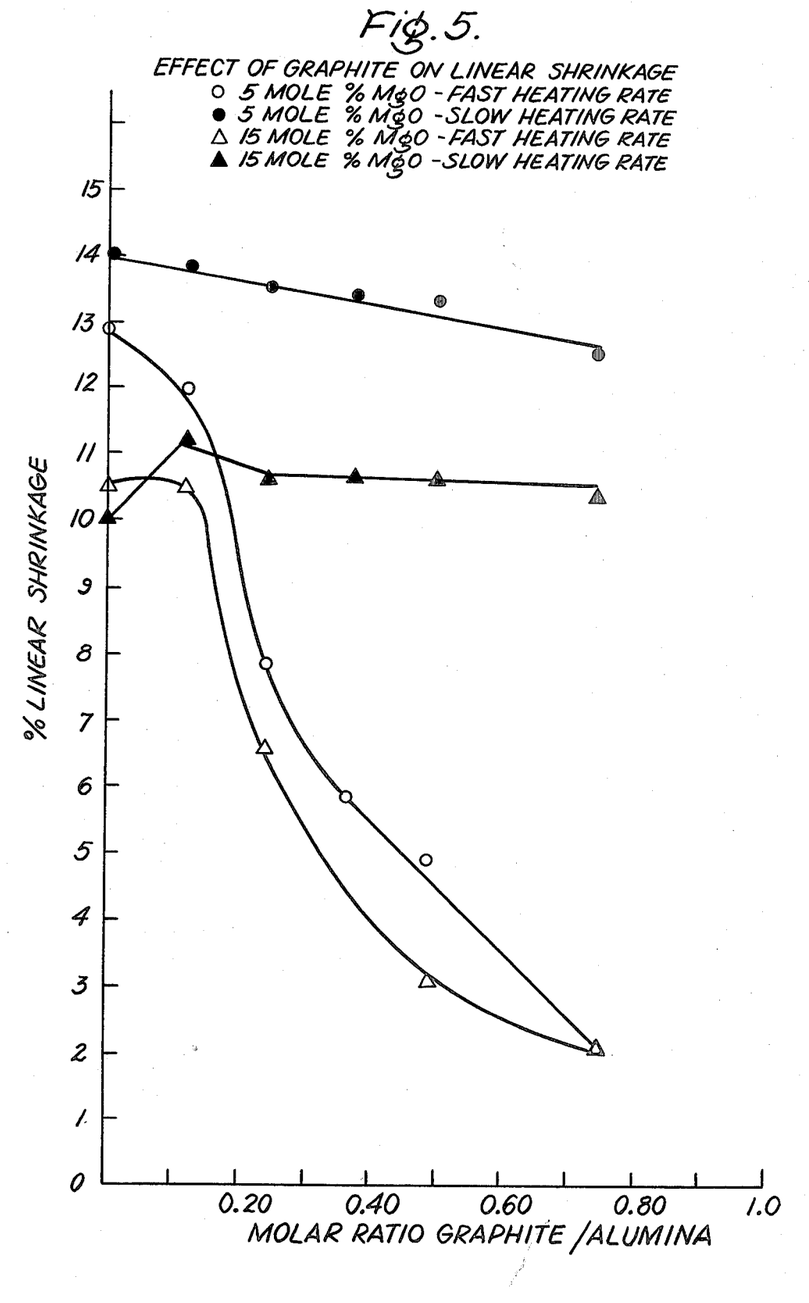
FIG. 5 is a plot showing the effect of graphite additions on the linear shrinkage of a fired alumina compact.

As shown in FIG. 5 the effects of carbon additions on the linear shrinkage of the fired ceramic is dependent upon the molar ratio of carbon to alumina, the amount of oxygen impurity in the atmosphere, and the heating rate.

As the molar ratio of carbon to alumina is increased the percent linear shrinkage of the compact is decreased. The molar ratio of carbon to alumina may be inadvertently reduced in the compact during the firing if oxygen impurities in the atmosphere react with a portion of the carbon in the compact to form CO or $CO_2$. In FIG. 5, the effect of the heating rate on the oxidation of carbon is shown. When a slow heating rate is employed, the carbon to alumina ratio is lowered by oxidation of carbon and high shrinkages result. When a fast heating rate is used the carbon to alumina ratio is not greatly affected by oxidation of carbon and low shrinkages result. If the firing atmospheres were completely free of any oxygen or water vapor the resulting linear shrinkage would be independent of the heating rate used and would only be a function of the initial carbon content. For example, when the carbon to alumina ratio is about 0.75, the linear shrinkage is only 2% if a fast heating rate is practiced when the controlled atmosphere includes the presence of oxygen as an impurity therein. In contrast, under the same conditions, with a slow heating rate, a linear shrinkage as high as 13% has been observed. A low shrinkage is desirable in producing the required close dimensional tolerances. The same effects are noted when undoped or pure alumina flour is employed in the core composition mix.

The percent linear shrinkage is also dependent on the grain size of the alumina flour employed. A larger grain size material will decrease the percent linear shrinkage which will occur. Therefore, as stated previously, the grain size of the alumina flour employed in making the fired compact 10 is preferably from about 1 micron to about 40 microns.

Although the molar ratio of carbon (with the carbon expressed as graphite) to alumina affects the various physical characteristics of the fired ceramic articles, the rate of heating concomitant with the oxygen partial pressure also has a pronounced effect on the fired articles. Therefore, an improperly fired ceramic article has less porosity, exhibits poorer crushability characteristics, undergoes higher shrinkage and requires a longer leaching time to remove the ceramic article from the casting.

Figure 6:
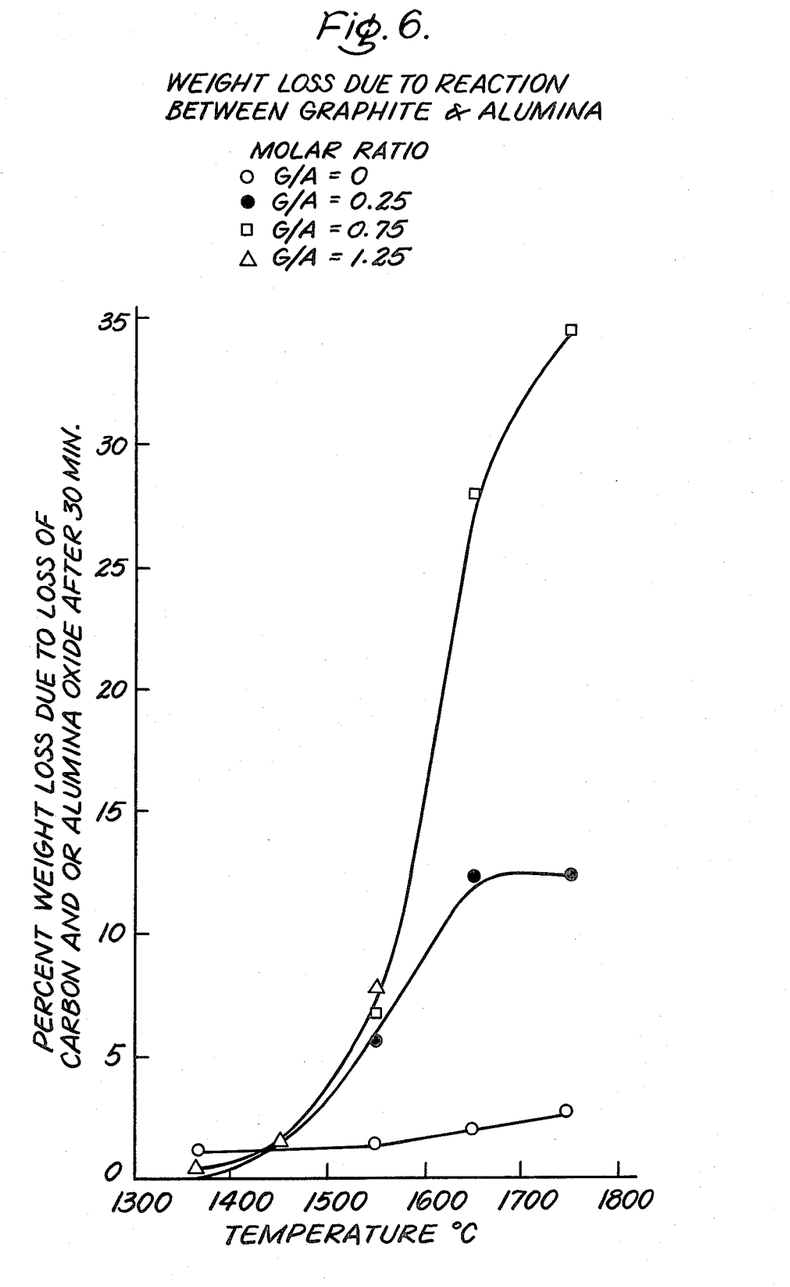
FIG. 6 is a plot showing the weight loss due to the reaction between graphite and alumina in a fired compact.

With reference to FIG. 6, the percent weight loss due to the loss of carbon and/or alumina is dependent upon the firing temperature. Above about 1550° C., the loss becomes appreciable and is related to molar ratio of carbon to alumina. The greater effect is noted when the molar ratio is of the order of 0.75 and above.

Figure 7:
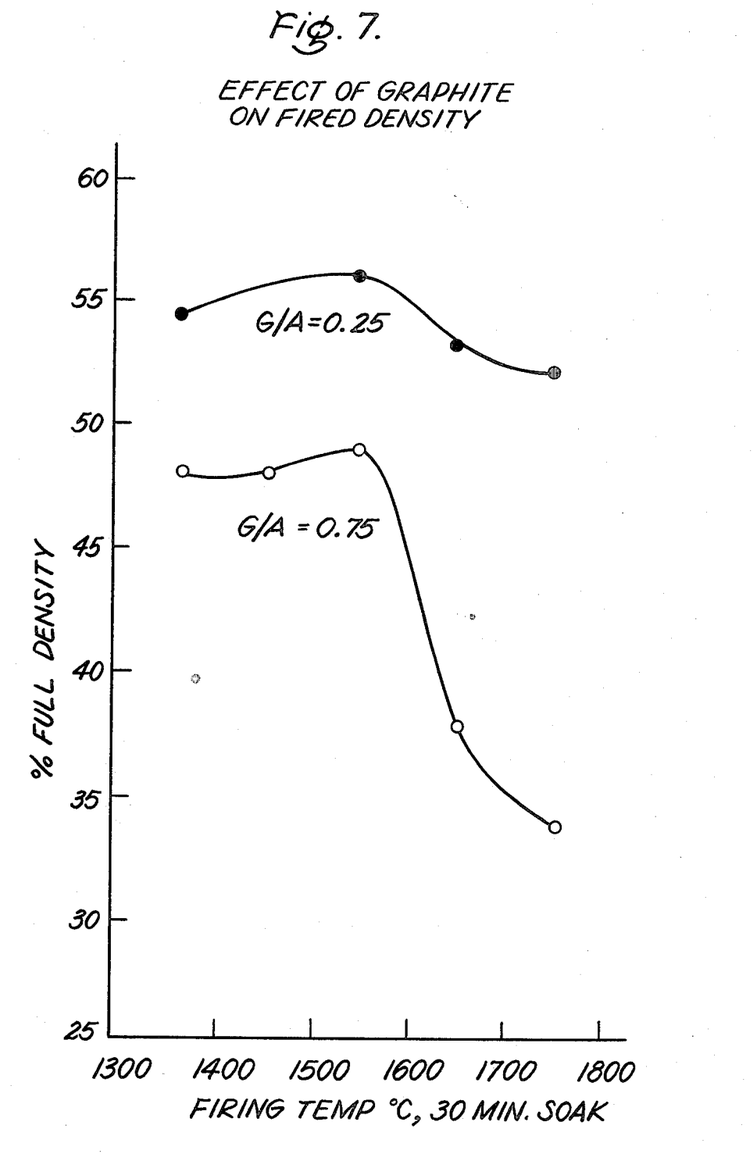
FIG. 7 is a plot showing the effect of graphite on the density of a fired compact.

Referring now to FIG. 7, the effect of the molar ratio of graphite to alumina, G/A, on the fired density or ceramic articles made from the material composition mix of this invention is shown. For molar ratios $0.25 < G/A < 0.75$, the fired density increases slightly with increasing temperature up to about 1500° C. Above 1500° C., the higher molar ratio materials show a significant decrease in the fired density of the ceramic article.

The following teachings of this invention reveal the effects of the dewpoint of the hydrogen gas. Equivalent partial pressures of the oxygen in inert gases can also be employed to form the desired structure of the fired compacts. However, for purposes of illustration only, and for no other reason, the invention is further described employing hydrogen gas having a given dewpoint range.

In order to form the outer portion 12 of alumina of varying density while maintaining continuous porosity therein and thereby achieving the desirable microstructure of inner portion 14, the compact 10 is fired at the elevated temperature of about 1500° C. and upwards in an atmosphere of controlled dewpoint hydrogen gas. The hydrogen gas has a dewpoint of less than −35° F. Preferably, the dewpoint of the hydrogen gas should be −80° F. or lower. The dryer the gas, the more the gas is suitable for the firing process. Suitable inert gases are argon, helium, neon and the like containing the desired partial pressure of oxygen.

The dewpoint should not exceed −35° F. (~200 ppm water) and is preferred to be less than −80° F. (~8 ppm water) since the compact undergoes less of a weight loss with increasing dewpoint values. This may occur as a result of the following reaction between water contained in the hydrogen gas and the reactant fugitive material carbon $$H_2O + C \rightarrow CO \uparrow + H_2 \uparrow \quad (3)$$

wherein an increase in the amount of $H_2O$ available for reacting with the carbon causes the compact to lose greater amounts of carbon through oxidation.

The low dewpoint gases are preferred since the distortion of the core decreases with decreasing dewpoint. To date, dewpoints of −35° F. and lower result in no appreciable distortion of the ceramic articles, and dewpoints of −80° F. or lower yield even less distortion.

The outer portion 12 has a thickness which may vary from 5 microns or less to about 100 microns. The thickness of the portion 12 depends upon the reactant fugitive filler content of the mixture. As the suboxides approach the surface, the oxygen in the ambient atmosphere reacts with the suboxide species and produces the density gradient 12 at the outer surface while retaining interconnected porosity therein. The center portion 14 has interconnected porosity which comprises from 40% to 60% by volume of the internal portion 14 of the core 10. The firing temperature has a range of from 1650° C. to about 1900° C. with a preferred range of from about 1750° C. to about 1850° C. The compact is fired in this range for a period of from about 15 minutes to about 4 hours in order to achieve the range of thickness of the outer portion 12.

Other suitable alumina starting materials may include rare earth doped alumina wherein the alumina is in excess and the reactant fugitive filler material will reduce the excess alumina present. Such materials include yttrium aluminate and lanthanum aluminate.

The composition of this invention when prepared for injection molding may be prepared in several ways. A preferred method embodies the use of the Sigma mixer having a steam jacket for heating the contents. When the plasticizer material is comprised of one or more waxes, the wax is placed in the mixer and heated to a temperature of from 80° C. to 110° C. to melt the wax or waxes. The additive agents of one or more deflocculents and aluminum stearate are then added, as required, in the desired quantities. The mixing is continued for about 15 minutes to assure a good mixture of the ingredients. The desired quantity of reactant fugitive filler material is then added and mixing, at the elevated temperature, is continued until all visible chunks of reactant fugitive filler material are broken up. To this mixture is then added the alumina bearing flour or mixture of flours of the desired size distribution. Mixing is then continued, in vacuum, at the elevated temperature for about 30 minutes or until the flour materials are universally distributed throughout the mixture. The heat is turned off and coolant water passed through the steam jacket to cool the mixture. Mixing is continued for a period of from 30 to 40 minutes, or until the mix is pelletized to a desired size of less than 2 cm.

Employing the composition mix of this invention one is able to injection mold complex shaped cores at from 200 psi to 10,000 psi and upwards to 50,000 psi at temperatures of from 80° C. to 130° C. The shrinkage of such composition mix is on the order of about 1 percent by volume.

The wax is removed from the pressed compact by heating the compact up to a temperature of less than 1100° C. to remove the organic binder. For example, the compact is heated to a temperature of several hundred degrees Celsius until the wax or plasticizer material drains from the compact. Preferably, the pressed compact is placed in high surface area carbon flour having a pore size less than the pore size of the pressed compact after wax removal. This enables the wax to be withdrawn by a capillary action induced by the finer pore size packing material. Other suitable packing materials are activated charcoal, high surface area carbon black and activated alumina. The wax, as described heretofore, is almost completely removed from the pressed compact at about 200° C. Subsequent heat treatment is used to sinter the compact or core material to increase its mechanical strength for handling purposes.

The firing schedule entails a partial removal of the wax from the compact by heating the compact at less than 25° C./hr to a temperature of no greater than 200° C. in packing material. The wax remaining is only of the order of from 2% by weight to 4% by weight. The compact is then removed from the packing powder and placed in the sintering furnace. The wax still remaining in the compact gives the compact good handling strength. A heating rate of less than 25° C. per hour is employed up to about 400° C. to remove the remainder of the wax. In order to avoid any oxidation of the reactant fugitive filler material, the subsequent heating rate should be as rapid as possible. The compact is thereafter heated at a rate greater than 200° C. per hour, preferably about 300° C. per hour, up to 1650° C. or higher, of the order of 1800° C., depending on the end use of the compact. Upon reaching this predetermined elevated temperature, isothermal heating is practiced for a sufficient time for the reactant fugitive filler material to react with the alumina present to produce the desired level of porosity in the compact. A preferred isothermal heating cycle is approximately 2 hours. Other heating schedules may be employed as long as care is taken to prevent oxidation of carbon and the subsequent distortion of the core.

Gaseous suboxides of alumina are formed in a reducing atmosphere above about 1500° C. to form the desired porous microstructure of the compact 10. The outer region 12, of varying density is composed of continuous porosity therein and is formed by oxidation of a portion of the aluminum suboxides. The portion of aluminum suboxides which are not employed in forming the barrier layer 12 escape from the compact 10 into the furnace atmosphere. The formation of the barrier layer 12 of the preferred microstructure occurs at dewpoints of less than −35° F. in hydrogen concomitant with a furnace temperature of greater than 1500° C., and preferably at least ~1800° C. The preferred atmosphere for commercial application is hydrogen with a dewpoint < −80° F. hydrogen.

It is significant to note that when the gases of the controlled atmosphere are completely free of oxygen or water vapor, the heating rate is of little or no importance.

When the fugitive reactant material is either aluminum or boron, the probable chemical reactions between alumina and aluminum and boron, include the following:

$$Al_2O_3 + 4Al \rightarrow 3Al_2O \quad (4)$$

$$Al_2O_3 + Al \rightarrow 3AlO \quad (5)$$

$$Al_2O_3 + 2B \rightarrow Al_2O + 2BO \quad (6)$$

$$Al_2O_3 + B \rightarrow 2AlO + BO \quad (7)$$

To illustrate the capability of either boron or aluminum to function as a reactant fugitive filler material, material compositions of alumina and reactant fugitive filler material were prepared. The molar ratio of reactant fugitive filler material to alumina was 1:2. The material compositions were mechanically mixed and pressed into pellets having a density of about 60% of theoretical. The pellets were then fired in hydrogen, dewpoint −33° F., and heated to an elevated temperature of 1765° C.±20° C. at a rate of 1300° C./hr. The pellets containing aluminum as a reactant fugitive filler material were isothermally heated at temperature for a period of 1 hour. The pellets containing boron as a reactant fugitive material were isothermally heated at temperature for a period of about 30 minutes. The pellets were removed from the furnace and cooled to room temperature and then examined.

The pellets having aluminum as a reactant fugitive material registered a weight loss of about 20 percent. The pellets fired density was about 63 percent of the theoretical density. The pellets having boron as a reactant fugitive material registered a weight loss of about 22 percent. The density of the pellets was about 45 percent theoretical.

Although it appears contrary to the teachings of this invention the result obtained is expected. One has to understand the difference between theoretical density, green density and fired density. 100 percent theoretical density of alumina is 3.96 g/cc and is a material constant. The solids content of the green compact, as molded, must be greater than 50% by volume. Therefore, the green density of the compact, after removal of the plasticizing agents, is of the order of from 50 to 60 percent of the theoretical fired density. Upon firing this green compact the actual density of the compact increases at first if bulk diffusion is the predominant process. The fired density of the alumina will continue to increase as sintering proceeds until the effects of the vapor transport process becomes dominant. Simultaneously the alumina is reduced chemically by the aluminum to the suboxide species and thereafter escapes in a volatile form. The escape of volatile gases will tend to decrease the observed fired density.

It is to be noted, however, that any increase in fired density of $Al/Al_2O_3$ compacts is still less than that curve for firing green alumina only—that is without any fugitive filler material therein.

With increasing amounts of aluminum as a reactant fugitive filler material, thereby increasing the evaporation-condensation sintering mechanism (vapor transport), the curve will shift downward and begin showing a decrease in actual fired density. This is the result of the increase in total alumina reaction with the reactant fugitive filler material and greater amounts of suboxides of alumina being produced and escaping entirely from the compact.

The results of the aluminum reactant fugitive filler example is a normal expectation for the amount of aluminum employed. That is, there is some increase in fired density to a predetermined level higher than the green density level before a falling off of the curve occurs, that is, a decrease in fired density. The actual range of aluminum to alumina molar ratio has not been established yet.

The teachings of this invention have been directed towards compacts employed as cores having a complex shape wherein metal cast about the core has a wall thickness of the order of 0.060 inch or less. Therefore, hot "cracking" is critical. When the wall thickness of the cast metal is greater, less porosity is required as the metal has strength to resist the forces exerted by the core. In such instances porosities less than 50 percent by volume can be tolerated. Therefore, compacts for such cores may be prepared with smaller amounts of the reactant fugitive filler. Compacts of simple shapes can be made by simple compaction and subsequent firing following most of the heating sequences described heretofore for compacts including a wax binder. The compact may comprise an alumina bearing flour of the desired particle size range and a reactant fugitive filler to produce the desired porosity content.

We claim as our invention:

1. A method for simultaneously forming a porous integral barrier layer having a density gradient across its thickness on all external surfaces of a fired ceramic article and for increasing the porosity content and the crushability characteristics of the interior portion thereby including the process steps of
    (a) preparing a material composition consisting essentially of an organic binder, a reactant fugitive filler material and an alumina flour, the particle size of the alumina flour and the reactant fugitive filler material is less than about 300 microns, and the binder comprises less than 50 percent by volume;
    (b) working a portion of the material composition to produce a preform of a predetermined shape;
    (c) heating the preform to remove the organic binder from the preform while retaining substantially all of the reactant fugitive filler material therein and to obtain a desired green strength;
    (d) firing the preform in a controlled atmosphere to react the alumina and the reactant fugitive filler material to produce at least one or more suboxides of alumina to produce a ceramic article having a predetermined continuous porosity content, grain morphology, and crushability characteristics, and
    (e) oxidizing at least a portion of the suboxides of alumina to form a porous integral barrier layer of alumina at the surface of the ceramic article, the layer having a density gradient across its thickness.

2. The method of claim 1 wherein
the preform of the material composition is heated in a controlled atmosphere at a rate of less than 100° C. per hour to a first temperature range of less than about 1100° C. to remove the organic binder,
the preform is heated in a controlled atmosphere at a rate of at least 100° C. per hour through a first predetermined temperature range of from about 1650° C. to about 1900° C.;

isothermally heating the preform within the second predetermined temperature range for a sufficient time to chemically react substantially all of the reactant filler material with alumina to form suboxides of alumina;

vapor transporting the suboxides to the vicinity of the surface of the ceramic article;

oxidizing the suboxides of alumina in the vicinity of the surface of the ceramic article to obtain the desired volume of continuous porosity therein, and forming the porous integral barrier layer of alumina having a density gradient across its thickness at the surface of the ceramic article.

3. The method of claim 2 wherein
the preform is heated in the second predetermined temperature range in a controlled atmosphere having an oxygen partial pressure which is the equivalent of the oxygen partial pressure present in wet hydrogen gas having a dewpoint range of less than about −35° F.

4. The method of claim 3 wherein
the controlled atmosphere in the second predetermined temperature range is hydrogen.

5. The method of claim 3 wherein
the controlled atmosphere in the second predetermined temperature range is an inert gas which is one selected from the group consisting of argon, helium and neon.

6. The method of either claim 1, 2, 3, 4 or 5 wherein
the reactant fugitive filler material is carbon.

7. The method of either claim 1, 2 or 3 wherein
the reactant fugitive fill material is one selected from the group consisting of aluminum, aluminum carbide, aluminum oxycarbide, boron and boron carbide.

8. The method of claim 2 wherein
heating the preform is at a rate of about 25° C. per hour up to about 400° C., heating the preform at a rate of from about 50° C. per hour to no greater than about 100° C. per hour from about 400° C. up to a temperature range of from 1100° C. to 1300° C., heating the preform at a rate of greater than 200° C. per hour up to a temperature of about 1650° C. or greater, and isothermally heating the preform for a predetermined period of time at the temperature of 1650° C. or greater.

9. The method of claim 8 wherein
the compact is placed in a fine flour up to about 1100° C. to 1300° C., the flour is one which is selected from the group consisting of alumina, carbon, activated charcoal, high surface area carbon black and activated alumina, the flour having a pore size which is smaller than that of the compact after removal of the binder, and removing the compact from the packing flour and continuing the heating.

10. The method of either claim 1 or 2 including the steps of
packing the compact in a fine flour which is one selected from the group consisting of alumina, activated alumina, carbon, activated charcoal, and high surface area carbon black, heating the packed compact at a rate of less than 25° C. per hour up to 200° C. to remove at least a portion of the binder material therefrom, removing the compact from the packing flour, heating the compact at a rate of less than 25° C. per hour up to 400° C. to remove the remainder of the binder material, heating the compact at a rate of greater than 200° C. per hour to at least 1650° C., and isothermally heating the compact at the last elevated temperature for a predetermined time period to obtain the desired physical properties.

11. The method of either claim 8 or 9, wherein the reactant fugitive filler material is carbon and the molar ratio of carbon to alumina is $0 \leq G/A \leq 1.25$.

12. The method of claim 10 wherein
the reactant fugitive filler material is carbon and the molar ratio of carbon to alumina is $0 \leq G/A \leq 1.25$.

13. The method of claim 11 wherein
the preferred particle size of the reactant fugitive filler material and the alumina material is from 1 micron to 50 microns.

14. The method of claim 12 wherein
the preferred particle size of the reactant fugitive filler material and the alumina material is from 1 micron to 50 microns.

15. The method of claim 6 wherein
the reactant fugitive filler material is carbon and the molar ratio of carbon to alumina is $0 \leq G/A \leq 1.25$.

16. The method of claim 6 wherein
the reactant fugitive filler material is carbon and the molar ratio of carbon to alumina is $0.1 < G/A < 0.4$.

17. The method of claim 6 wherein
the reactant fugitive filler material is carbon and the molar ratio of carbon to alumina is $0.2 < G/A < 0.3$.

18. The method of claim 3 wherein
the dewpoint range is less than about −80° F.

* * * * *